(12) United States Patent  
Park

(10) Patent No.: US 7,344,604 B2
(45) Date of Patent: Mar. 18, 2008

(54) LED AND A LIGHTING APPARATUS USING THE LED

(75) Inventor: Chan Young Park, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/326,427

(22) Filed: Jan. 6, 2006

(65) Prior Publication Data

US 2006/0163555 A1 Jul. 27, 2006

(30) Foreign Application Priority Data

Jan. 7, 2005 (KR) ............ 10-2005-0001705

(51) Int. Cl.
*H01L 29/00* (2006.01)

(52) U.S. Cl. ............ 148/33; 148/33.4; 148/33.5; 362/800

(58) Field of Classification Search ......... 362/296, 362/800; 148/33, 33.4, 33.5
See application file for complete search history.

(56) References Cited

U.S. PATENT DOCUMENTS

| 6,328,456 | B1 * | 12/2001 | Mize | 362/311 |
| 6,367,949 | B1 * | 4/2002 | Pederson | 362/240 |
| 6,815,312 | B2 * | 11/2004 | Furukawa et al. | 438/455 |
| 6,818,465 | B2 * | 11/2004 | Biwa et al. | 438/22 |
| 7,045,905 | B2 * | 5/2006 | Nakashima | 257/787 |
| 7,093,954 | B2 * | 8/2006 | Sharrah et al. | 362/202 |

FOREIGN PATENT DOCUMENTS

KR 1999-0032097 A 5/1999

* cited by examiner

*Primary Examiner*—Ali Alavi
*Assistant Examiner*—William J. Carter
(74) *Attorney, Agent, or Firm*—Birch, Stewart, Kolasch & Birch, LLP

(57) ABSTRACT

Disclosed herein is a LED and a lighting apparatus, which employs a LED as a light source of low power and high efficiency for an optical projection system. The lighting apparatus comprises a reflection part together with the LED, and enhances light emitting directionality of the LED, thereby generating parallel light or focused light suitable for the light source of the optical projection system. The LED comprises a negative electrode and a positive electrode formed on an identical plane with different stack constructions, thereby reducing the number of wires between the electrodes occupying a predetermined volume. In addition, the substrate and the electrodes are made of a transparent material to transmit light therethrough, so that the light source using the LED radiates light in all direction as in the light source using the arc discharge, without shielding the light at a rear side by the electrodes.

14 Claims, 7 Drawing Sheets

LED AND A LIGHTING APPARATUS USING THE LED

This application claims the benefit of Korean Patent Application No. 10-2005-0001705, filed on Jan. 7, 2005, which is hereby incorporated by reference as if fully set forth herein.

BACKGROUND OF THE INVENTION

1. Field of the Invention

The present invention relates to a LED and a lighting apparatus using the LED, and more particularly, to a lighting apparatus using the light emitting diode (LED) as a light source for an optical projection system.

2. Discussion of the Related Art

Generally, an optical projection system has employed a high pressure mercury lamp, a halogen lamp, a xenon lamp, etc., which emits light via an arc discharge, as a light source. However, the light source using the arc discharge has problems of high power consumption, requirement for high voltage and generation of heat during operation, and possibility of high pressure gas exploding. Furthermore, with such a light source, it is difficult to achieve highly pure colors due to a wide range of its light spectrum.

FIG. 1 is a plot depicting the spectrum of a light source of the optical projection system using the arc discharge. Here, the light source employs light of partial ranges corresponding to some parts of Red (R), Green (G), and Blue (B) ranges, respectively.

Referring to FIG. 1, among wavelength bands of R, G and B colors, the wavelength band of G color exhibits a great intensity of light, whereas the wavelength bands of B and R colors exhibit a small intensity of light. In particular, since B color has the lowest spectral sensitivity, the darkest color range is provided in the wavelength band of B color. In view of this, in order to realize a color image corresponding to an input image signal, a white balance must be obtained by reducing light intensity of green and red colors corresponding to the lowest light intensity of blue color. However, with the method as described above, only a part of the light from the lamp is used, and the light intensity of the particular colors must be reduced in order to achieve the white balance, thereby lowering utilization efficiency of light. In addition, it is difficult to exhibit pure and relatively natural colors since a wide range of wavelengths are used for emitting each color.

Accordingly, it has been suggested to employ a LED as a light source of low power and high efficiency. The LED is a device used to emit light according to an electrical signal, and generally used for small scale optical components and display devices as it can be driven with lower power. In particular, although the LED has not been used for a light source requiring high brightness, the LED has been continuously enhanced in light emitting efficiency, and thus found new applications for light sources requiring high brightness. Recently, the LED can be applied to the light source for the optical projection system, such as a projector, a projection TV, and the like.

However, due to feature of its configuration, it is difficult for the LED to provide parallel light or focused light which is required for the optical projection system as the light source. Furthermore, light is shielded by electrodes of the LED, and is emitted only in one direction. Accordingly, in order to employ the LED as the light source of the optical projection system, it is necessary to include an additional lens assembly which can provide optical characteristics required for the optical projection system.

SUMMARY OF THE INVENTION

Accordingly, the present invention is directed to a lighting apparatus using a light emitting diode that substantially obviates one or more problems due to limitations and disadvantages of the related art.

An object of the present invention is to provide a lighting apparatus, which employs a LED as a light source of low power and high efficiency for an optical projection system, comprises a reflection part, and enhances light emitting directionality of the LED so as to generate parallel light or focused light suitable for the light source of the optical projection system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a lighting apparatus, comprising: a reflection part having a focus; a LED located at the focus of the reflection part; and a connecting part to secure the reflection part and the LED.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First, the case where an optical projection system uses an arc discharge will be compared with the case where an optical projection system uses a LED, and then the present invention will be described in view of this comparison hereinafter.

Figure 1:
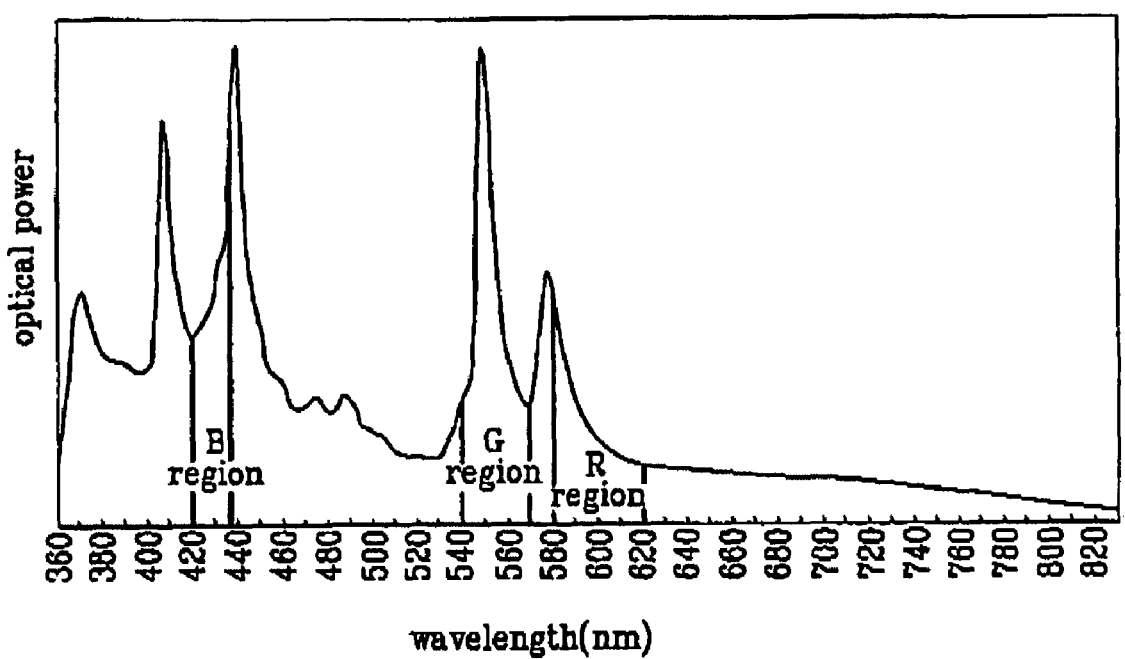
FIG. 1 is a plot depicting a spectrum of a light source of an optical projection system using an arc discharge.
Figure 2:
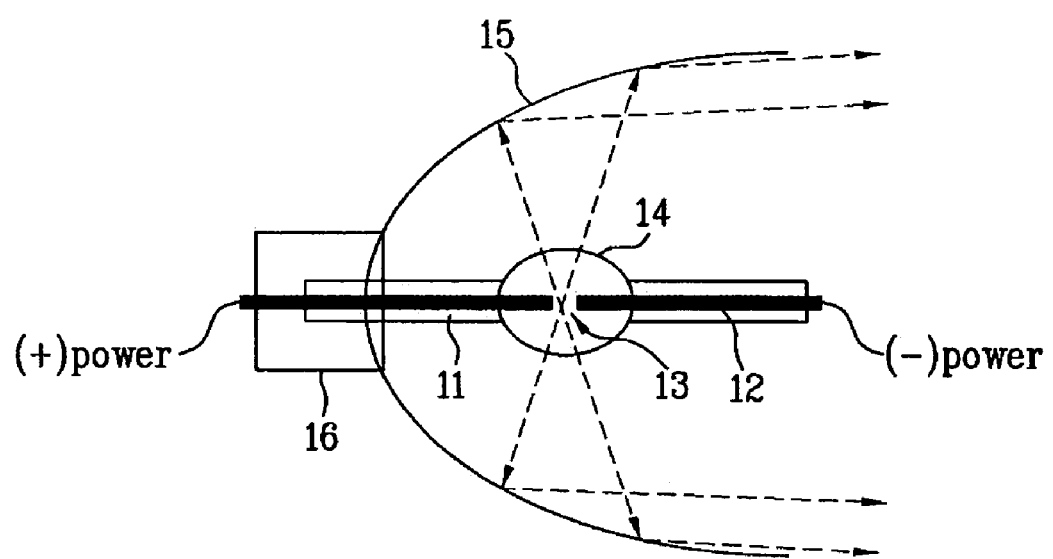
FIG. 2 is a view illustrating the structure of the light source of the optical projection system using the arc discharge.

FIG. 2 is a view illustrating the structure of a light source of the optical projection system using the arc discharge. As shown in FIG. 2, when using the arc discharge, the optical projection system comprises a positive electrode 11, and a negative electrode 12 which are made of a metallic material and separated by an electrode separation 13 of about 1 mm from each other. Tips of the respective electrode 11 and 12 are connected to power sources having identical polarities, respectively. The positive electrode 11 and the negative electrode 12 are positioned within a bulb 14 which is filled with a mercury gas. Consequently, when a high voltage difference is created between the positive electrode 11 and the negative electrode 12, discharge occurs in the electrode separation 13. The discharge excites energy of the surrounding mercury gas to emit light, which is reflected by a reflection part 15 and emitted in front of the system. At this time, with the reflection part 15 formed to a parabola shape and the electrode separation 13 located at a focus of the parabola, the emitted light travels as parallel light. Here, a second connecting member 16 can fix the electrodes 11 and 12 of the lamp, the bulb 14, the reflection part 15, and the like.

Figure 3:
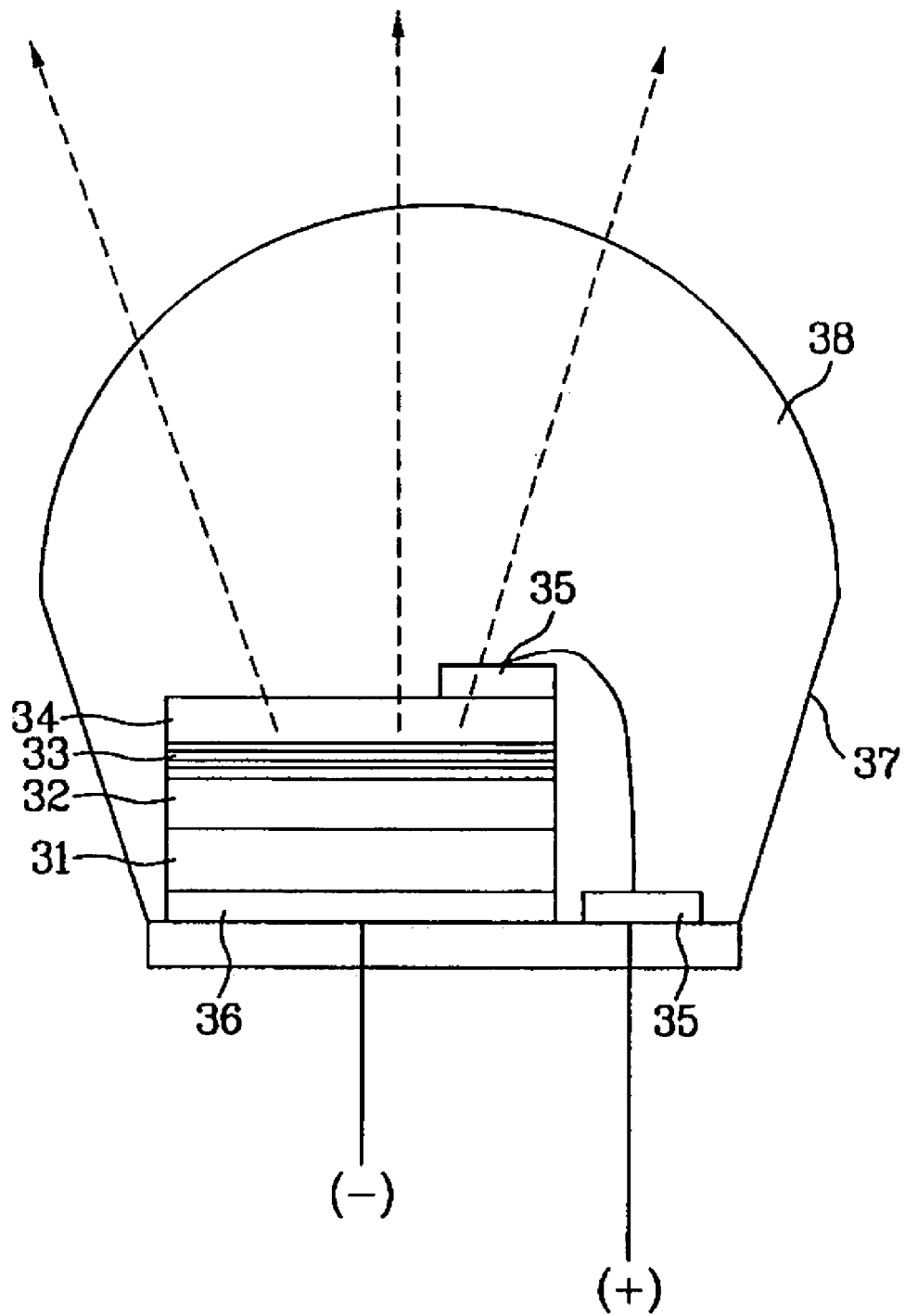
FIG. 3 is a view illustrating the structure of a LED used for a light source of the optical projection system.

FIG. 3 is a view illustrating the structure of the light source using a LED. Referring to FIG. 3, the LED comprises an n-type layer 32, a light emitting layer 33, and a p-type layer 34 sequentially stacked on a substrate 31. A positive electrode 35 is brought into contact with the p-type layer 34 to connect the p-type layer 52 to a (+) power source, and a negative electrode 36 is brought into contact with the substrate 31 to connect the substrate 31 to a (−) power source. Then, when applying voltage to the positive and negative electrodes 35 and 36, electrons are moved due to potential difference, causing change in energy of the light emitting layer 33, so that the LED emits light. Light emitted from the light emitting layer 33 radiates in all directions. At this time, in order to collect the light in one direction, a reflection part 37 is provided at one side of the light source to reflect the light. Then, the light is focused by a focusing lens 38, and is emitted in one direction. However, even in this case, since it is difficult to obtain parallel light or focused light, it is difficult to use the LED for the light source of the optical projection system.

The structure and embodiments of a lighting apparatus using a LED in accordance with the present invention will be described hereinafter with reference to the drawings.

Figure 4:
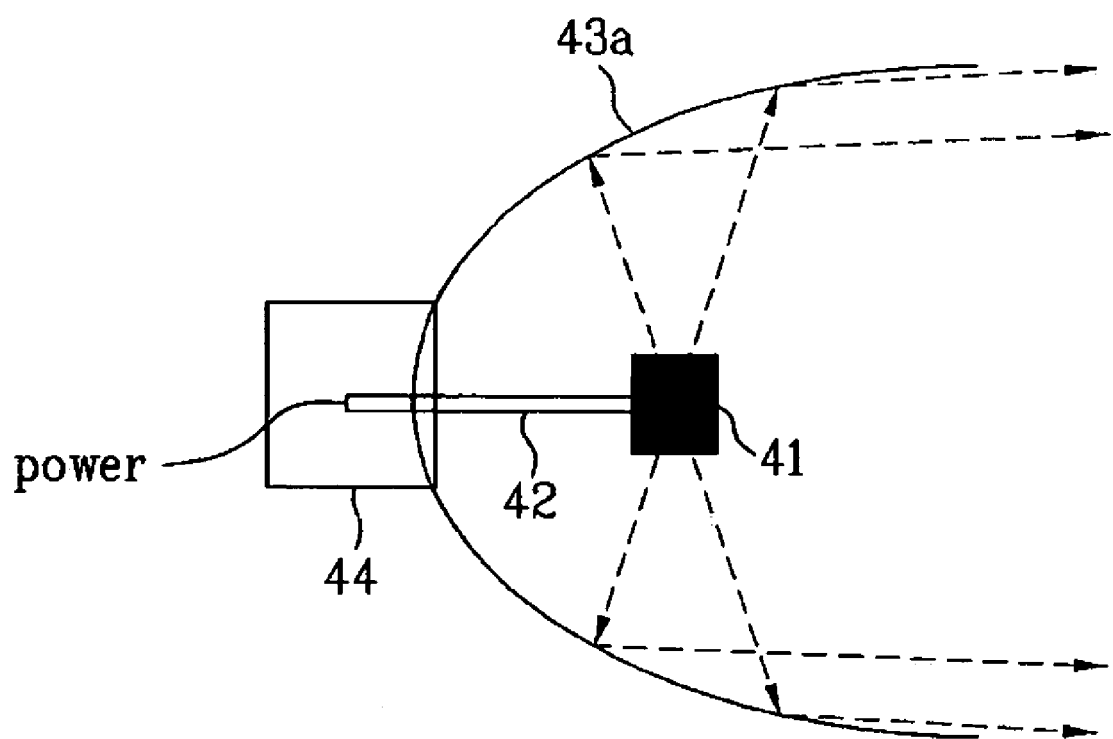
FIG. 4 is a constructional view illustrating the structure of a lighting apparatus using a LED in accordance with the present invention.
Figure 5:
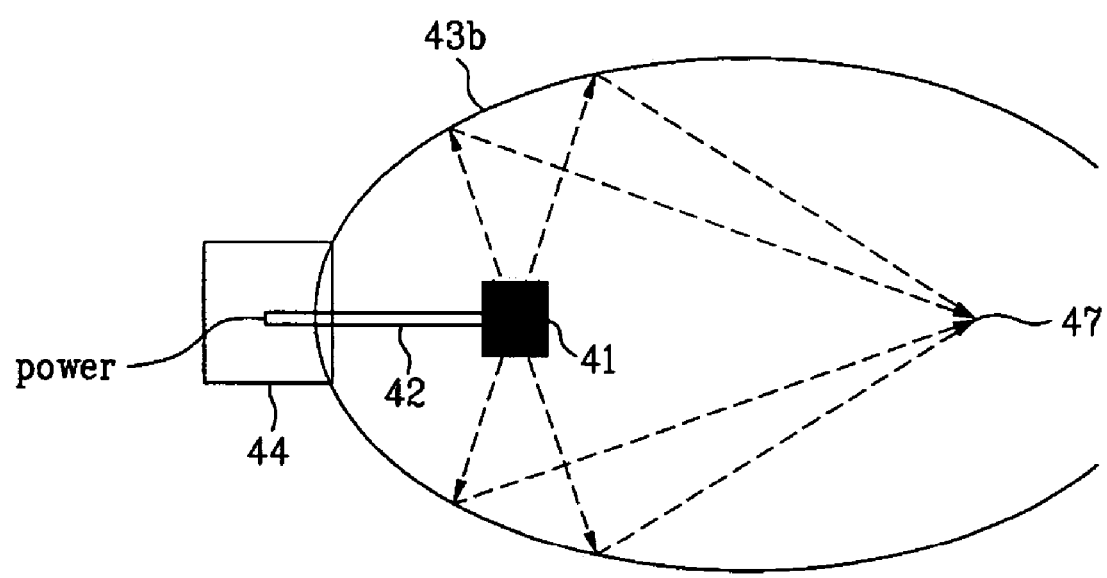
FIG. 5 is another constructional view illustrating the structure of a lighting apparatus using a LED in accordance with the present invention.

FIG. 4 and FIG. 5 is a constructional view illustrating the structure of the lighting apparatus using the LED in accordance with the present invention. As shown in FIG. 4, the lighting apparatus of the invention comprises a LED 41, a reflection part 43 to reflect light emitted from the LED 41 and allow reflected light to travel in a specific direction, and a connecting part to secure the LED 41 and the reflection part 43.

The LED 41 comprises a negative electrode and a positive electrode formed on an identical plane with different stack constructions, thereby reducing the number of wires between the electrodes occupying a predetermined volume. In addition, the substrate and the electrodes are made of transparent materials to transmit light therethrough, so that the light source using the LED radiates light in all direction as in the light source using the arc discharge, without shielding the light at a rear side of the LED by the electrodes.

The reflection part 43 preferably has a parabola shape or an elliptical shape. In the case where the reflection part has the parabola shape 43a, the light becomes parallel light, and in the case where the reflection part preferably has the elliptical shape 43b, the light is focused at a second focus. Thus, the reflection part can have different shapes according to utility of the optical projection system.

The connecting part comprises a first connecting member 42 to connect the LED 41, and a second connecting member 44 to connect the first connecting member 42 and the reflection part 43. With this structure, the first connecting member 42 locates the LED 41 at the focus of the reflection part 43.

In addition, the first connecting member 42 is connected to the electrodes of the LED 41 to supply electric power while dissipating heat emitted from the LED 41 to cool the LED 41. At this time, the first connecting member 42 is preferably made of metal having electrical conductivity. Since the metal has high electric and thermal conductivity, the first connecting member 42 allows electric power to be easily supplied to the LED 41, while allowing the LED to be easily cooled by dissipating heat generated from the LED 41 to the outside.

Figure 6:
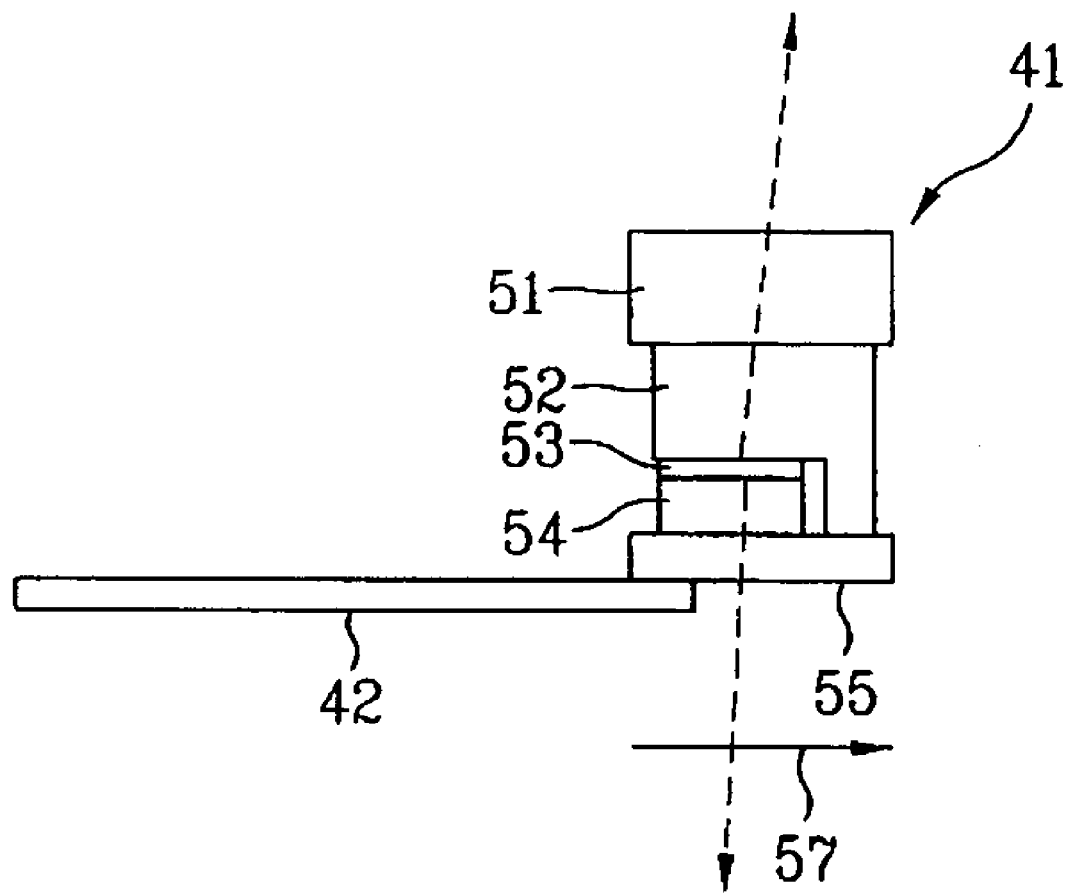
FIG. 6 is a constructional view illustrating a detailed structure of an embodiment of a LED used for the lighting apparatus in accordance with the present invention.

FIG. 6 shows a detailed structure of an embodiment of a LED used for the lighting apparatus in accordance with the present invention. As shown in FIG. 6, the LED 41 comprises an n-type layer 54, a light emitting layer 53, and a p-type layer 52 sequentially stacked on a substrate 51. A positive electrode is brought into contact with the p-type layer 52 to connect the p-type layer 52 to a (+) power source, and a negative electrode is brought into contact with the n-type layer 54 to connect the n-type layer 54 to a (−) power source, so that light is emitted via potential difference. At this time, as shown in FIG. 6, some portion of the p-type layer 52 extends to a surface of the n-type layer 54 so as to be coplanar with the surface of the n-type layer 54, and is connected to an electrode member 55. The electrode member 55 comprises the positive electrode in contact with the p-type layer 52, and the negative electrode in contact with the n-type layer 54. Preferably, the electrode member 55 is made of a transparent material to transmit light emitted from the light emitting layer 53 through the electrode member 55.

A method for producing the LED of the first embodiment will be described. First, a p-type layer 52, a light emitting layer 53, and an n-type layer 54 are sequentially stacked on a substrate 51. At this time, the substrate 51 is made of a transparent material to transmit light therethrough. In addition, some portion of the p-type layer 52 extends to a surface of the n-type layer 54 until it is coplanar with the surface of the n-type layer 54, so that the p-type layer 52, the light emitting layer 53 and the n-type layer 54 are coplanar with each other on the surface of the electrode member 55 opposite to the substrate 51. Then, the stacked LED 41 is inverted, and positioned on the electrode member 55 such that the p-type layer 52 and the n-type layer 54 are connected to the positive electrode and the negative electrode of the electrode member 55, respectively. With this structure, the LED can act as a light source which can emit light in all directions.

The first connecting member 42 is preferably coupled to the electrode member 55 in parallel to a stacking direction 57 of the LED 41. With this structure, light is emitted from the light emitting layer 53 of the LED 41 in all directions.

At this time, preferably, the first connecting member 42 locates the LED 41 at the focus of the reflection part 43, and coupled to the electrode member 55 in parallel to the stacking direction 57 of the LED 41.

As shown in FIG. 4 and FIG. 5, the reflection part 43 may have a parabola shape 43a or an elliptical shape 43b. However, the present invention is not limited to this structure, and the reflection part 43 may have a different shape with a different focus according to the utility of the optical projection system as mentioned above.

The LED of the first embodiment as described above has the structure which can prevent light emitted from the LED from being shielded by the electrodes or the wires between the electrodes, and can provide parallel light by reflecting the light emitted from the LED located at the focus.

Figure 7:
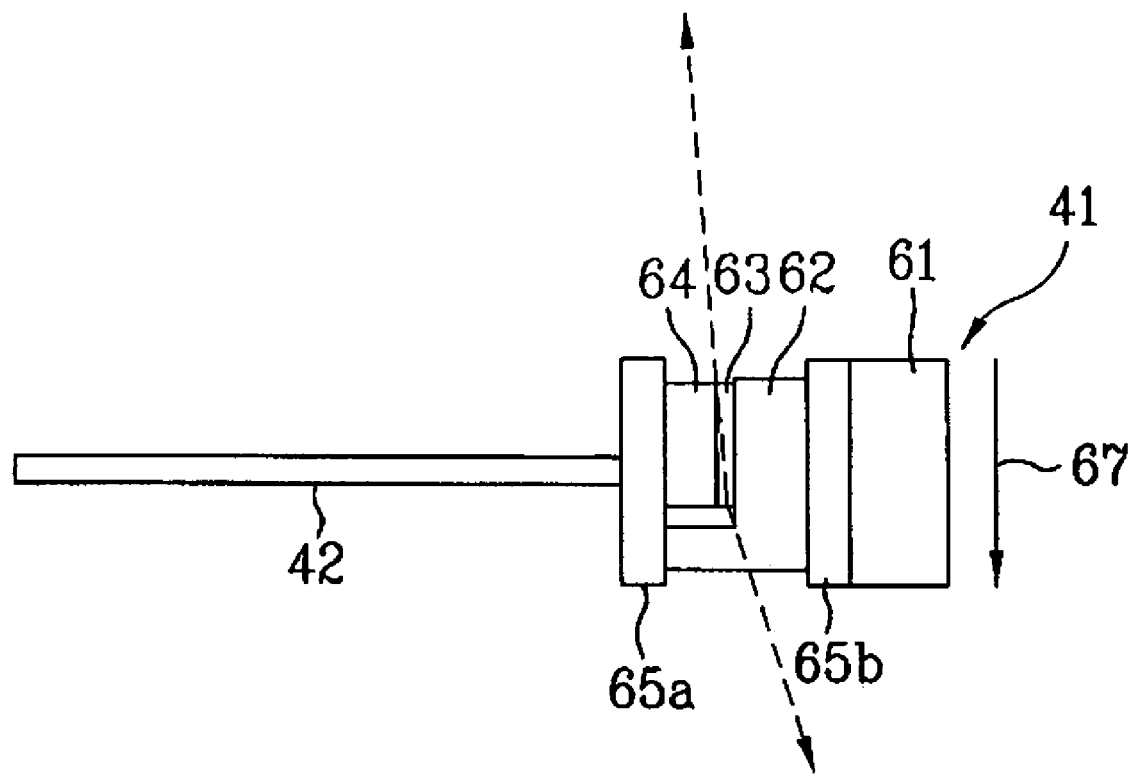
FIG. 7 is a constructional view illustrating a detailed structure of another embodiment of a LED used for the lighting apparatus in accordance with the present invention.

FIG. 7 shows a detailed structure of another embodiment of a LED used for the lighting apparatus in accordance with the present invention. The same construction of the second embodiment as the first embodiment will not be described hereinafter.

As shown in FIG. 7, a LED 41 comprises a first reflection layer 65b and a second reflection layer 65a formed of a metallic material at opposite sides of a light emitting layer 63, respectively. At this time, preferably, the second reflection layer 65a acts as an electrode member of the LED while reflecting light.

A method for producing the LED of the second embodiment will be described. First, a first reflection layer 65b of a metallic material is formed on a LED substrate 61. Then, a p-type layer 62, a light emitting layer 63, and an n-type layer 64 are sequentially stacked on the first reflection layer 65b. At this time, some of the p-type layer 62 extends to a surface of the n-type layer 64 so as to be coplanar with the surface of the n-type layer 64. Then, the stacked LED 41 is inverted, and bonded to the second reflection layer 65a. At this time, the p-type layer 62 and the n-type layer 64 of the LED 41 are connected to a positive electrode and a negative electrode provided to the second reflection layer 65a, respectively. Here, it is desirable that the first connecting member 42 be connected to the second reflection layer 65a in perpendicular to a stacking direction 67 of the LED 41.

With this structure, light from the light emitting layer 63 of the LED is reflected between the first and second reflection layers 65a and 65b, and emitted from the sides of the LED, so that the light is emitted in upper and lower directions.

Operation of a lighting apparatus using the LED according to the present invention will be described in detail as follows.

In the lighting apparatus using the LED of the invention as shown in FIG. 4 and FIG. 5, the LED 41 is supplied with electric power from the electrodes, and emits light. The LED 41 is connected to the first connecting member 42, and located at a specific position. With the conventional LED, since the rear side of the LED is shielded by the electrodes or other components due to feature of its configuration, light travels only in one direction, and is focused at a specific angle. However, according to the present invention, light is emitted from the LED 41 in all directions.

In other words, with the structure of the LED 41 as shown in FIG. 6, light emitted from the light emitting layer of the LED 41 radiates in all directions. In particular, since the LED 41 has the transparent rear side, light can travel through the rear side of the LED 41. In addition, the LED 41 of the invention can remove the focusing lens and the wires between the electrodes which occupy 90% of the total volume of the LED 41, and minimize an area which can be shielded by the first connecting member 42, thereby solving such a problem that the connecting members and the electrodes of the reflection layer shield light propagation. Furthermore, when using the LED, it is possible to form the same light source as the case where a general lamp is used as the light source.

With the structure of the LED 41 as shown in FIG. 7, light is reflected between two reflection layers 65a and 65b, and emitted from the sides of the LED 41. That is, the light is emitted in all directions including the upper and lower directions.

After being emitted from the LED 41 in all directions, light is reflected by the reflection part 43, and travels in a specific direction. At this time, the reflection part 43 has such a shape which can provide optical characteristics required for the optical projection system. In other words, when parallel light is required, the reflection part is formed to the parabola shape 43a, and when focused light is required, it is formed to the elliptical shape 43b. Here, it is desirable that the LED 41 be positioned at the focus of the reflection part 43, and connected by the first connecting member 42. When the parallel light is required, as shown in FIG. 4 light emitted from the LED positioned at the focus of the reflection part 43a travels parallelly. On the contrary, as shown in FIG. 5 when the focused light is required, light emitted from the LED positioned at the focus of the reflection part 43b is focused on the second focus, and then travels.

The first connecting member 42 and the reflection part 43 are bonded and connected to the second connecting member 44. The first connecting member 42 is connected to an external power source, and supplies electric power to the LED 41.

As apparent from the above description, the lighting apparatus using the LED according to the present invention provides advantageous effects as follows.

First, the LED is constructed as the light source of the optical projection system to ensure low power consumption and high efficiency, so that light of a narrow wavelength band is emitted, thereby achieving highly pure colors.

In addition, the lighting apparatus comprises the reflection part together with the LED, and enhances light emitting directionality of the LED, thereby providing parallel light or focused light suitable for the light source of the optical projection system instead of the bulb and electrodes of the lamp.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A lighting apparatus, comprising:
   an LED (light emitting diode) to emit light and including an n-type layer, a light emitting layer, and a p-type layer sequentially stacked and connected to an electrode member, one end portion of the p-type layer extending to a surface of the n-type layer to be coplanar with a surface of the n-type layer such that the p-type layer and the n-type layer are respectively connected to a positive electrode and a negative electrode of the electrode member on an identical plane and the other end portion of the p-type layer not extending to the surface of the n-type layer;
   a reflection part to reflect the light emitted by the LED; and
   a connecting part to connect the reflection part and the LED such that the LED is located at a focus of the reflection part.

2. The lighting apparatus according to claim 1, wherein the electrode member is made of a transparent material.

3. The lighting apparatus according to claim 1, wherein the reflection part has a round shape having the focus.

4. The lighting apparatus according to claim 1, wherein the reflection part has a parabola shape to parallelly reflect the light emitted from the LED.

5. The lighting apparatus according to claim 1, wherein the reflection part has an elliptical shape to focus the light emitted from the LED.

6. The lighting apparatus according to claim 1, wherein the connecting part comprises:
   a first connecting member to connect the LED; and
   a second connecting member to connect the first connecting member and the reflection part.

7. The lighting apparatus according to claim 6, wherein the first connecting member is made of metal having electrical conductivity.

8. The lighting apparatus according to claim 6, wherein the first connecting member supplies electric power to the electrode member of the LED while dissipating heat emitted from the LED to cool the LED.

9. The lighting apparatus according to claim 6, wherein the first connecting member is coupled to the electrode member.

10. The lighting apparatus according to claim 9, wherein the first connecting member is coupled to the electrode member in parallel to a stacking direction of the LED.

11. The lighting apparatus according to claim 6, further comprising:
    first and second reflection layers having the light emitting layer interposed therebetween.

12. The lighting apparatus according to claim 11, wherein the electrode member is the second reflection layer serving to reflect the light emitted from the light emitting layer.

13. The lighting apparatus according to claim 11, wherein the first connecting member is coupled to the second reflection layer.

14. The lighting apparatus according to claim 13, wherein the first connecting member is coupled to the second reflection layer in perpendicular to a stacking direction of the LED.

* * * * *